United States Patent [19]
Cronin et al.

[11] Patent Number: 5,804,853
[45] Date of Patent: Sep. 8, 1998

[54] STACKED ELECTRICAL DEVICE HAVING REGIONS OF ELECTRICAL ISOLATION AND ELECTRICAL CONNECTIONS ON A GIVEN STACK LEVEL

[75] Inventors: John Edward Cronin, Milton; John Kenneth DeBrosse, Burlington, both of Vt.; Hing Wong, Norwalk, Conn.

[73] Assignee: International Business Machines Corporation, Armonk, N.Y.

[21] Appl. No.: 686,881

[22] Filed: Jul. 26, 1996

Related U.S. Application Data

[62] Division of Ser. No. 540,387, Oct. 6, 1995, Pat. No. 5,602,051.

[51] Int. Cl.$^6$ .................................................. H01L 27/108
[52] U.S. Cl. ...................... 257/309; 257/303; 257/306; 257/309
[58] Field of Search ................... 257/68, 69, 71, 257/303, 306, 307, 308, 309, 66, 67, 65

[56] References Cited

U.S. PATENT DOCUMENTS

| | | | |
|---|---|---|---|
| 4,882,289 | 11/1989 | Moriuchi et al. | 437/52 |
| 4,907,046 | 3/1990 | Ohji et al. | 357/23.6 |
| 4,970,564 | 11/1990 | Kimura et al. | 357/23.6 |
| 5,012,310 | 4/1991 | Kimura et a. | 357/23.6 |
| 5,140,389 | 8/1992 | Kimura et al. | 357/23.6 |
| 5,177,576 | 1/1993 | Kimura et al. | 257/71 |
| 5,188,975 | 2/1993 | Kojima et al. | 437/48 |
| 5,196,910 | 3/1993 | Moriuchi et al. | 357/23.6 |
| 5,214,496 | 5/1993 | Sunami et al. | 257/296 |
| 5,237,528 | 8/1993 | Sunami et a. | 365/149 |
| 5,264,712 | 11/1993 | Murata et al. | 257/71 |

OTHER PUBLICATIONS

"A 1.28 $\mu m^2$ Bit–Line Shielded Memory Cell Technology for 64 Mb DRAMs", Kawamoto et al., 1990 Symposium on VLSI Technology, 13–14 no month.

"3–Dimensional Stacked Capacitor Cell for 16M and 64M DRAMs", Ema et al., *IEDM*, 592–595 (1988) no month.

*Primary Examiner*—Carl W. Whitehead
*Attorney, Agent, or Firm*—Heslin & Rothenberg, P.C.

[57] ABSTRACT

A semiconductor structure having electrical conductors positioned over each other, but electrically isolated from each other, is disclosed. The lower conductor has a recess in its upper surface, and the recess is at least partially filled with an oxide-type material, thereby isolating the lower conductor from the upper conductor. These conductors would normally contact each other because of the somewhat imprecise patterning and etching steps used to fabricate a multitude of conductive elements, e.g., in a very dense semiconductor structure. Stacked capacitor cells incorporating this structure are also disclosed.

11 Claims, 6 Drawing Sheets

STACKED ELECTRICAL DEVICE HAVING REGIONS OF ELECTRICAL ISOLATION AND ELECTRICAL CONNECTIONS ON A GIVEN STACK LEVEL

This application is a division of U.S. Ser. No. 08/540,387, filed Oct. 6, 1995, which is now U.S. Pat. No. 5,602,051, issued Feb. 11, 1997.

TECHNICAL FIELD

The present invention relates generally to semiconductor devices, and more particularly, to highly integrated, multi-level devices requiring discrete areas of electrical insulation and electrical contact in proximity to each other.

BACKGROUND

The integration density of semiconductor devices has quadrupled over a short period of time. This feat has been accomplished by miniaturization of the size of the device, according to demanding ground rules for fabrication. Common features on or within a typical device, such as electrical studs, isolation trenches, and wiring patterns, have had to be positioned unusually close to each other.

The extreme proximity of conductive elements may result in serious problems if the elements are designed to be insulated from one another. Inadvertent contact can lead to electrical shorts and failure of the semiconductor device. In a multi-level device in which each level contains various conductive elements, the problem can be especially difficult. For example, in a given device, some of the conductive elements on a lower level are designed to contact conductive elements on an adjacent upper level, while other lower level conductive elements perform different functions and must remain isolated from upper level elements which happen to be situated immediately above them. However, in preparing the device, conventional patterning and etching steps (e.g., directional reactive ion etching (RIE)) may not discriminate between elements which are designed to contact each other, and those requiring separation by way of an intervening insulating layer. Of course, various masking steps could be employed to prevent the unwanted exposure of one particular conductive element to another. However, increasing the number of masking and patterning steps often adds complexity to the overall device fabrication process. This in turn can decrease manufacturing productivity and increase overall costs.

One example of a semiconductor structure susceptible to this problem is a dynamic random access memory (DRAM) device. High density DRAM's often utilize stacked capacitor (STC) cells, which provide a great deal of storage capability. An illustration of DRAM devices utilizing some form of STC technology is found in U.S. Pat. No. 5,196,910 and 5,140,389, as well as in an article by Y. Kawamoto et al in the 1990 Symposium on VLSI Technology, pages 13–14, entitled "A 1.28 um$^2$ Bit-Line Shielded Memory Cell Technology for 64 Mb DRAMs". The general design and function of STC cells utilized in random access memory is known in the art. These cells represent key elements in the design of high-speed, low-power DRAM's of the 64 megabit class.

The Kawamoto article mentioned above describes a "bit-line shielded" STC cell, in which the storage capacitor—a cylindrical node or "chimney"—is formed over a bit-line. The cell also contains the other necessary functional terminal for memory, i.e., a word line. The article also includes the description of a method for fabricating the storage cell.

A version of a typical STC cell is provided in FIG. 1. Many of the features in this figure are similar to those in the device of the Kawamoto article, although this version of an STC cell utilizes a bit-line stud and a capacitor stud. The use of studs can result in a denser, more integrated cell. Such a cell often tends to function with lower bit-line and word line capacitance, which is usually very desirable. Also, the overall process involved in forming a stud-structure type of cell utilizes intermediate (i.e., as-formed) surfaces which are more "planar". In contrast, the type of cell described in Kawamoto involves intermediate surfaces which are less planar, i.e., more conformal. Greater planarity allows for easier focusing of printing tools during photolithographic steps.

Most of the techniques for forming such a cell will be described further on in the specification, with reference to FIGS. 3–6, which are based on the present invention. With reference to FIG. 1, this type of cell is generally disposed on silicon substrate 10, in which shallow trench oxide (STI) regions 12A and 12B are formed. Impurity diffusion regions 14A and 14B abut the STI regions.

An etch stop layer 16 is usually formed over the STI regions, and then insulating region 18 is applied over layer 16. Word line 20 (formed as described below) is surrounded by insulating cap layer 26, and cap layer spacers 27A and 27B. Bit-line stud 22 and capacitor stud 24 are situated within region 18, and are separated by oxide layer 28 and a portion 30 of insulating region 18. Both of the studs are made of a conductive material. Stud differentiation layer 34 is deposited or formed on a portion of the exposed surfaces of insulating region 18. Bit-line 36 can be formed as described below, and contacts a portion of the upper surface of bit-line stud 22. The bit-line is usually covered by an insulating bit-line cap layer 38.

Storage capacitor nodes 40 and 42 constitute the main storage elements in the STC. They can be prepared by various techniques, such as the one described in the Kawarnoto article. The nodes themselves are usually formed of a material like polysilicon, surrounded by a node dielectric layer 48. A conductive "plate" or layer 50 covers each of the nodes.

In a highly integrated device such as this one, conductive elements may be very close to each other, but perform very different functions, and can in fact be independently connected to very different parts of the same device, or to other devices within an integrated circuit. Thus, despite their proximity, electrical contact between two elements has to be prevented sometimes to, in turn, prevent shorting and failure of the device.

As a specific example, some types of STC cells like that of FIG. 1 require contact between storage node 42 and capacitor stud 24 for proper operation. At the same time, however, these types of cells require that storage node 40 be separated, i.e., electrically isolated, from bit-line stud 22. (Node 40 may be electrically connected to an entirely different feature in the cell, or to a different device).

Keeping nearby conductors electrically isolated from each other in a highly integrated STC cell is a very difficult task because of the steps required to fabricate such a cell. In the example of FIG. 1, word line 20, cap layer 26, and studs 22 and 24 are each formed within insulating region 18 by separate, conventional steps. The studs are substantially coplanar. The required openings for all of these features are usually prepared by applying a suitable photoresist layer (not shown), and then patterning the photoresist to define the dimensions of the opening.

The defined area is directionally etched using, for example, reactive ion etching (RIE) techniques. The same types of procedures are used to form bit-line 36. The bit-line 36 is isolated from the capacitor stud 24 by the stud-differentiation layer 34, which initially was a continuous layer over insulating region 18. Bit-line 36 is isolated from subsequently-formed storage capacitor nodes 40 and 42 by spacers 37A, 37B, and by cap oxide layer 38. The storage nodes are usually formed simultaneously, via a technique such as that set forth in the Kawamoto article. As in the case of the studs, formation of the nodes of a desired size, and at a desired location, usually requires precise patterning of an applied resist in the appropriate locations, followed by etching the defined pattern.

However, the steps involved in node formation can lead to undesirable overlap between node 40 and bit-line stud 22. When stud differentiation layer 34 is first etched to allow bit-line 36 to contact bit-line stud 22, but not capacitor stud 24, the alignment may be less than exact. This results in a portion of the upper surface of stud 22 being left exposed, which in turn results in the subsequent, undesirable contact between node 40 and bit-line stud 22 (see area 32). As mentioned above, this contact may, at a minimum, cause an electrical short.

Elimination of the overlap problem is generally not possible when using current photolithographic imaging techniques to define a multitude of closely-spaced features, since these techniques require a certain minimum tolerance in the alignment of a given mask to a pattern on a substrate. In fact, the extreme emphasis on high density integration has made the overlap problem more severe.

FIG. 2 is a simplified, graphical depiction of potential, undesirable overlap between various regions on the planar surface of an STC cell being prepared (and within the cell itself), as various, sequential stages of photolithographic imaging are carried out. The figure is a plan view, as taken from the top of the structure, and includes the relative positions of capacitor stud 52, bit-line stud 53, first bit-line 54, second bit-line 55, word line 56, first capacitor node 57, and second capacitor node 58. In brief, the inability to ensure perfect alignment during imaging results in unwanted overlap between areas being defined and then etched. An illustrative area of this overlap is designated as region 59.

One technique for dealing with overlap and the undesirable consequences noted above involves the use of an additional mask specifically applied and patterned on the top surface of bit-line stud 22 (FIG. 1), prior to formation of the capacitor nodes. As noted above, however, the use of additional masks usually adds complexity and cost to the fabrication process. In fact, the use of masks for this purpose might actually become impossible as the dimensions of semiconductor structures are dramatically reduced.

It should thus be apparent that a need exists for a method of efficiently isolating conductors which happen to be situated very closely to each other, and which are formed by standard patterning and etching techniques.

The method should be applicable to very highly integrated, multi-level devices, such as stacked capacitors, without decreasing the density of the device, or exceeding the boundaries of lithographic capabilities.

Moreover, devices prepared by such a method should retain their performance capabilities. In the case of an STC cell, for example, a large storage capacitance should be maintained.

DISCLOSURE OF INVENTION

The needs discussed above have been satisfied by the discovery of an improved semiconductor structure, comprising:

(a) a first lower conductor disposed in an insulating region, and having an upper surface and a lower surface;

(b) a second lower conductor disposed in the insulating region, electrically isolated from the first lower conductor, and having an upper surface and a lower surface;

(c) a first upper conductor disposed over at least a portion of the first lower conductor; and electrically isolated therefrom; and (d) a second upper conductor disposed over at least a portion of the upper surface of the second lower conductor; and electrically connected thereto.

In this device, the first lower conductor has a recess in its upper surface that is self-aligned to the first upper conductor. The recess is at least partially filled with an insulator, thereby electrically isolating the first lower conductor from the first upper conductor.

An exemplary device based on this type of structure is a stacked capacitor cell, in which the upper conductors are storage capacitor nodes, one of the lower conductors is a bit-line stud, and the other lower conductor is a capacitor stud. The unique features of this invention allow appropriate electrical contact between the capacitor stud and an overlying storage node, while preventing electrical contact between the bit-line stud and the other storage node.

Another aspect of this invention is based on an improved method for electrically isolating a first lower conductor disposed in an insulating region from a first upper conductor disposed over at least a portion of the first lower conductor, in the presence of a second lower conductor and a second upper conductor.

This method finds particular usefulness in fabrication processes which involve multiple lithographic and etching steps to form elements which are designed to be extremely close to one another, yet electrically isolated from each other. As described in the text which follows, the method involves formation of a self-aligned recess in the upper surface of one of the lower conductors, followed by at least partially filling the recess with an insulator material.

Other details and features of this invention will become clear from the following description of the preferred embodiments, taken in conjunction with the accompanying drawings.

BEST MODE FOR CARRYING OUT THE INVENTION

Figure 1:
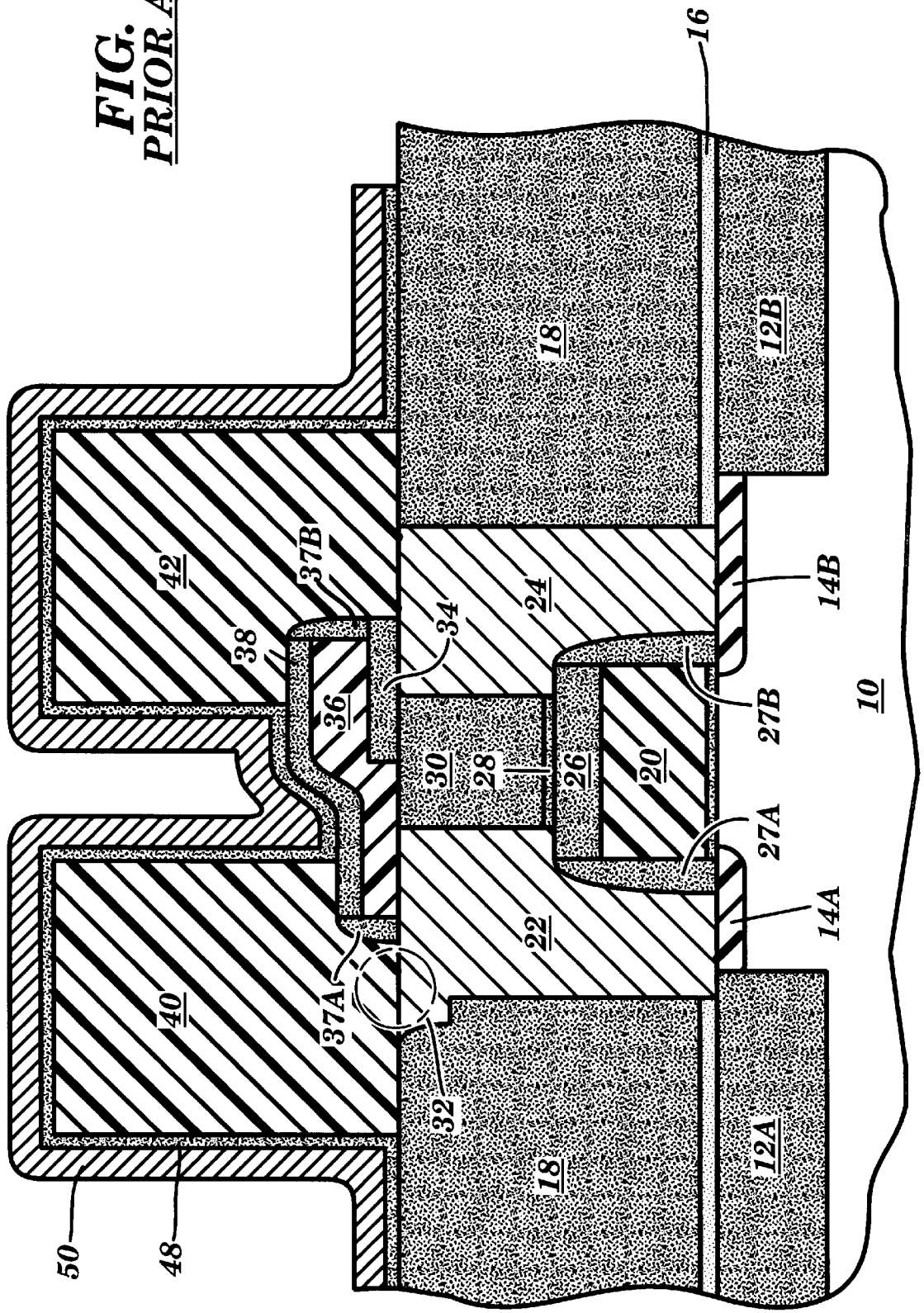
FIG. 1 is a cross-sectional view of a stacked capacitor cell, in the event that steps are not taken to prevent overlap between a bit-line stud and a storage capacitor node.
Figure 2:
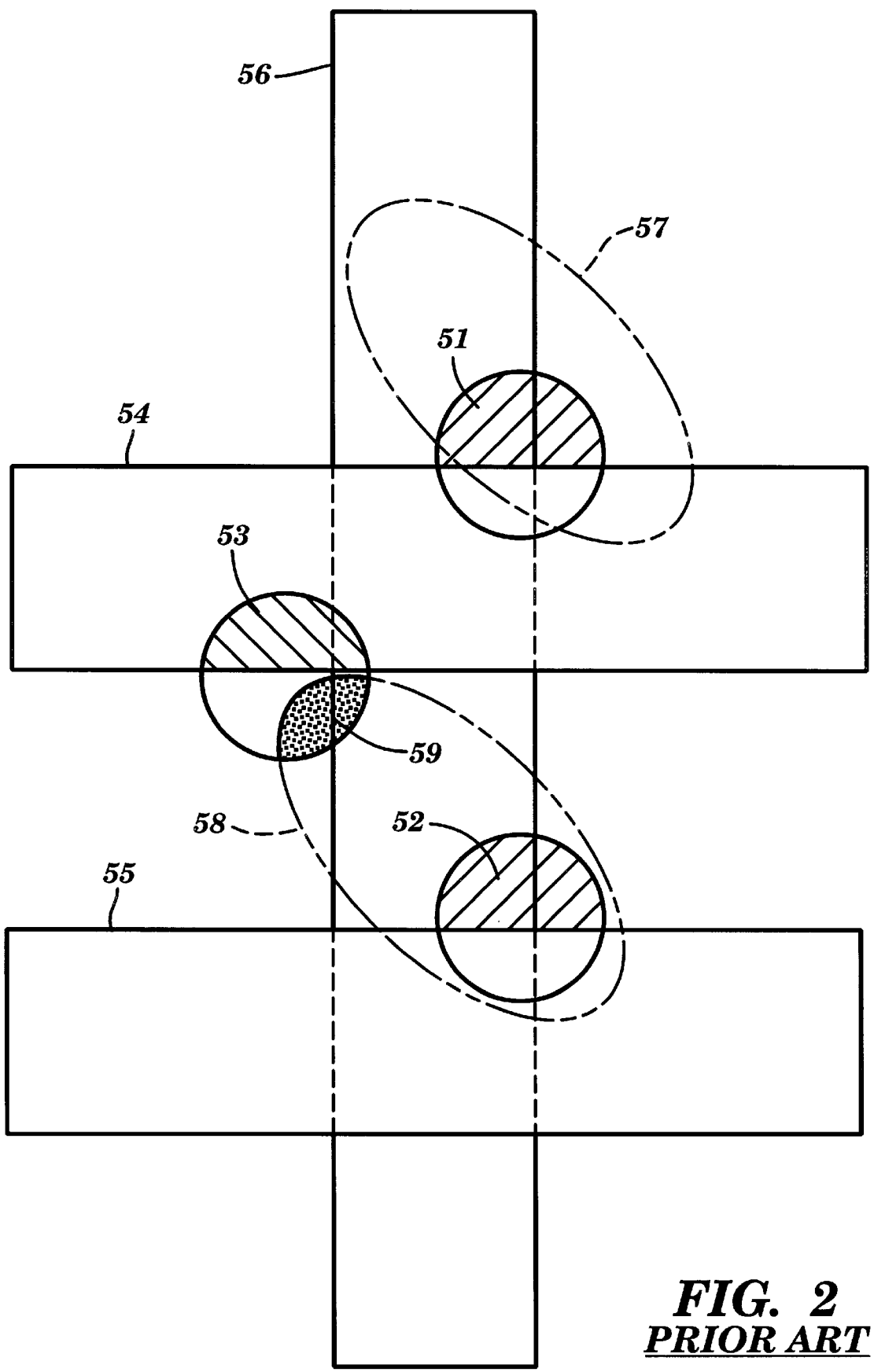
FIG. 2 is a graphical plan view depicting potential areas of overlap between a bit-line stud and a storage capacitor node in a stacked capacitor cell.
Figure 3:
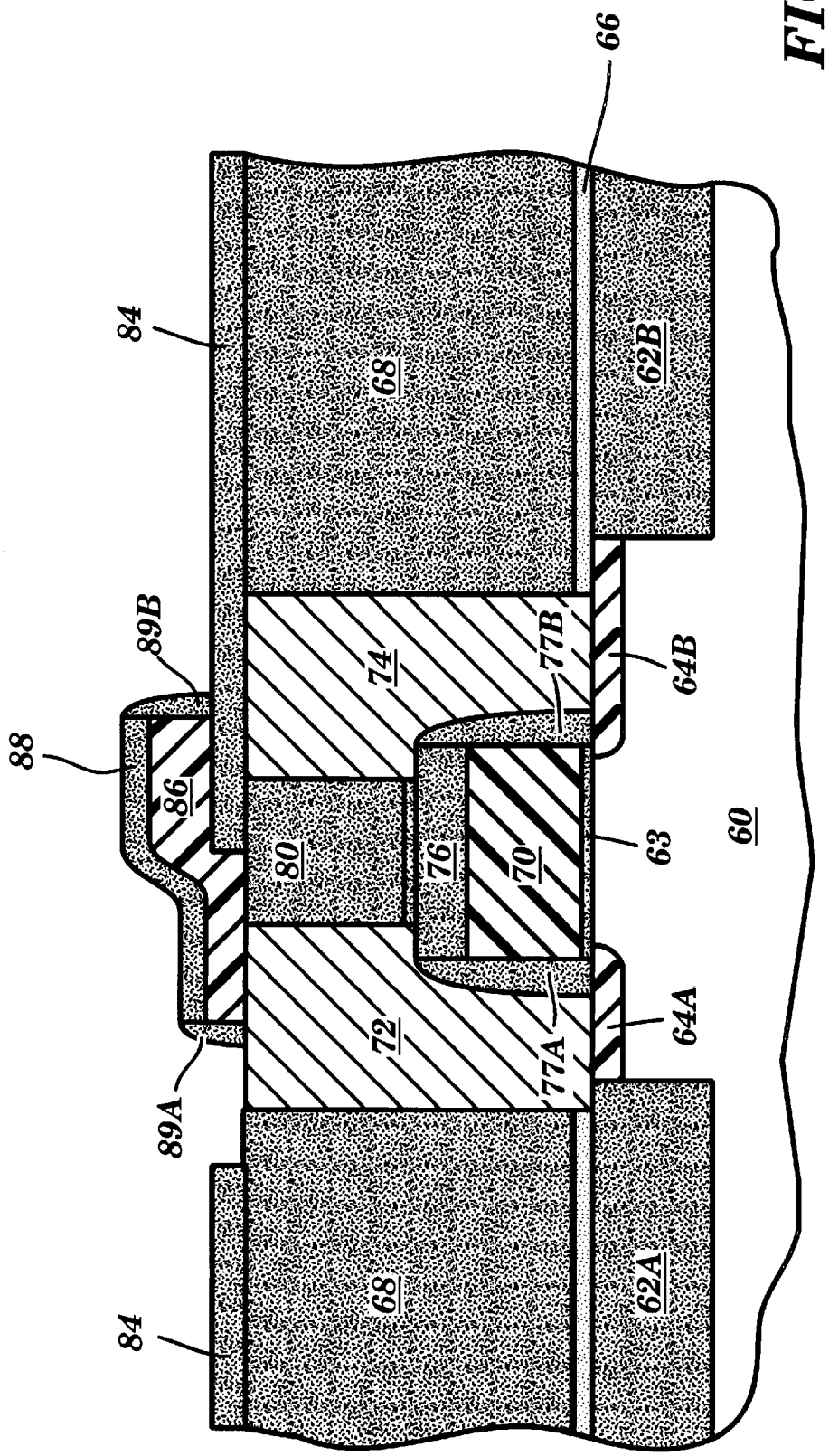
FIG. 3 depicts a stacked capacitor cell based on this invention, in the preliminary stages of preparation.

FIG'S. 1 and 2 have already been discussed above. FIG. 3 is a cross-sectional view depicting an STC cell according to the present invention, in its initial stages. Substantially all of the features shown can be identical in form and function to the analogous features in FIG. 1, except as otherwise noted. The preparation of the STC can, for the most part, be carried out by conventional techniques. Shallow trench isolation (STI) regions 62A and 62B can be prepared by first etching trenches in the desired areas within substrate 60 (which itself is usually a silicon material). The trenches can then be filled with an oxide material such as CVD-deposited silicon dioxide, and planarized to the surface.

Information regarding specific details of STI is readily available in the art, e.g., see the article by B. Davari et al in the 1988 IEDM 88 Technical Digest, Cat. No. 88 CH2528-8, p. 92–95. However, those of ordinary skill in the art understand that other conventional types of isolation are possible for the base of an STC. LOCOS isolation is one example of such an alternative.

Gate oxide layer 63 is next formed, usually by thermal oxidation of the substrate. This oxide layer typically has a thickness in the range of about 50 Angstroms to about 200 Angstroms.

Following formation of the gate oxide, word line 70 is formed. The word line is often made of polysilicon, but it could alternatively be formed of other materials, e.g., a refractory metal like tungsten or molybdenum, or an alloy of a refractory metal with any conventional material, e.g., disilicides of molybdenum, tantalum, or tungsten. It can be formed by any conventional technique, e.g., chemical vapor deposition (CVD), low temperature-CVD, plasma-enhanced CVD (PECVD), evaporation, and the like. The word line may also be referred to as a "gate electrode conductor" because of its function in a transistor, as mentioned below.

Following formation of word line 70, insulating cap layer 76 is formed. This layer is advantageously deposited (e.g., by CVD) as a blanket material over all of the exposed surfaces, and then masked and etched to the appropriate shape. Directional etching, by RIE, for example, leaves cap layer spacers 77A and 77B. Thus, the continuous layer formed by the cap layer and spacers serves to insulate the word line from other conductive regions of the structure, e.g., the studs described below.

Next, diffusion regions 64A and 64B are formed. These regions often serve as the source and drain elements of a conventional metal oxide semiconductor field effect transistor (MOSFET), with word line 70 serving as the gate. Techniques for forming the diffusion regions are known in the art. Usually, an appropriate dopant is implanted into the sections of the substrate which are to become diffusion regions. The choice of dopant will of course depend on the particular type of device being formed. For example, boron is usually employed as the dopant when an FET device of the p-channel type is desired. Arsenic or phosphorous is usually the dopant when an FET device of the n-channel type is desired.

Methods of implanting the dopant are well-known in the art and described, for example, in the following references: *Microelectronics*, by J. Millman, McGraw-Hill, 1979; *Fundamentals of Semiconductor Devices*, by E. S. Yang, McGraw-Hill, 1978; and *VLSI Technology* S.M. Sze (Ed.), McGraw-Hill, 1988. An ion implanter is typically employed for the actual implantation. An inert carrier gas such as nitrogen is usually used to bring in the impurity source, e.g., diborane, phosphine, or arsine.

Passivation layer 66 is next applied. This layer is preferably a nitride-type material like silicon nitride, and is relatively thin, e.g., about 50 Angstroms to about 1000 Angstroms. The passivation layer prevents ionic materials from entering the STI-oxide regions. It also serves as an etch stop. The common methods can be used to apply the passivation layer, e.g., CVD or low temperature CVD.

Insulating region 68, as depicted in FIG. 3, can also be deposited by conventional techniques. As an example, silicon dioxide or reactive precursors like silane could be deposited by CVD or low temperature CVD. After being deposited, insulating region 68 is usually planarized, e.g., by chemical-mechanical polishing (CMP), which is described in the following U.S. patents, all of which are incorporated herein by reference: U.S. Pat. No. 5,292,689; U.S. Pat. No. 5,234,868; U.S. Pat. No. 4,944,836; and U.S. Pat. No. 4,910,155. As planarized, region 68 usually has a thickness of about 3000 Angstroms to about 15000 Angstroms, although this will depend in part on the designed size of the STC cell.

Bit-line stud 72 and capacitor stud 74 are then fabricated. They are usually formed during the same step, for the sake of process efficiency. Typically, a mask (not shown) is used to define suitable vias through insulating region 68, followed by conventional etching procedures to bring the vias to the depth of passivation layer 66. Following removal of the mask, a conductive material is deposited to simultaneously fill the vias. The conductor is usually a material like doped polysilicon, or a refractory metal or metal alloy, such as molybdenum, tungsten, platinum, tantalum disilicide, or titanium disilicide.

Metallization techniques for preparing features like metallic studs are wellknown in the art and described, for example, in *VLSI Technology*, 2nd Edition, S.M. Sze, 1988, McGraw-Hill Publishing Company. (Chapter 9 of this reference relates specifically to this topic, but the entire content of the Sze text is generally relevant, and is therefore incorporated herein by reference). Metal deposition can be carried out by known techniques like those discussed above, e.g., CVD, sputtering, evaporation, and the like. The selection of particular equipment and process parameters for deposition (including the deposition of a polysilicon stud) can be determined by one skilled in semiconductor processing, without undue effort.

The particular dimensions of the studs will depend on a variety of factors, such as the size of the particular STC cell being manufactured. In general, each stud is approximately the minimum feature size of the particular generation of cell array being fabricated. If a stud is excessively tall, capacitance may be too great, while an excessively short stud may result in insufficient capacitance. As a non-limiting illustration, the height of a stud for an STC cell of a DRAM of 256 mega-bits will usually be in the range of about 3000 Angstroms to about 10,000 Angstroms, while its width will usually be in the range of about 2000 Angstroms to about 4000 Angstroms. The upper surfaces of studs 72 and 74 are usually planarized, e.g., by the CMP technique mentioned above.

Stud differentiation layer 84 of FIG. 3 is then applied over the exposed surface of the studs and insulating region 68, and patterned with a stud differentiation mask (not shown). As patterned, this layer ensures that the bit-line (described below) contacts bit-line stud 72, but does not contact capacitor stud 74. Stud differentiation layer 84 should be thick enough to reduce parasitic capacitance to the capacitor stud, but thin enough to permit easy etching. The thickness of layer 84 should also be less than that of cap oxide layer 88, discussed below, to prevent spacer 89A from being "pulled down" during the recess-etching step described below, thereby exposing the bit-line. The thickness of the stud differentiation layer is usually about 200 Angstroms to about 1000 Angstroms for the DRAM size mentioned above.

Layer 84 is typically formed of silicon dioxide, but it could alternatively be formed of various other materials, e.g., silicon nitride, or a composite of silicon oxide and silicon nitride. The layer may be deposited by the usual techniques, e.g., some form of CVD.

Bit-line .86 of FIG. 3 is next formed. A substantially conductive material is used to form the bit-line. Examples include a refractory metal such as tungsten, or a refractory metal-silicide composite. The bit-line is usually deposited conformably, e.g., by the use of a CVD technique, in which a blanket material is deposited over the entire surface and then patterned and etched to desired dimensions. The function of the bit-line in an STC cell is also well-known in the art.

Cap oxide layer 88 is also formed by initially depositing a blanket-like, conformal layer, e.g., by CVD, and then patterning and etching to the appropriate dimensions. Spacers 89A and 89B are formed when the blanket layer of cap oxide material is etched in a direction substantially vertical to the substrate surface. The cap oxide layer insulates bit-line 86 from the storage capacitor nodes which will subsequently be built above the bit-line. It is usually made of silicon dioxide, although other insulating materials or combinations of materials could be utilized.

Figure 4:
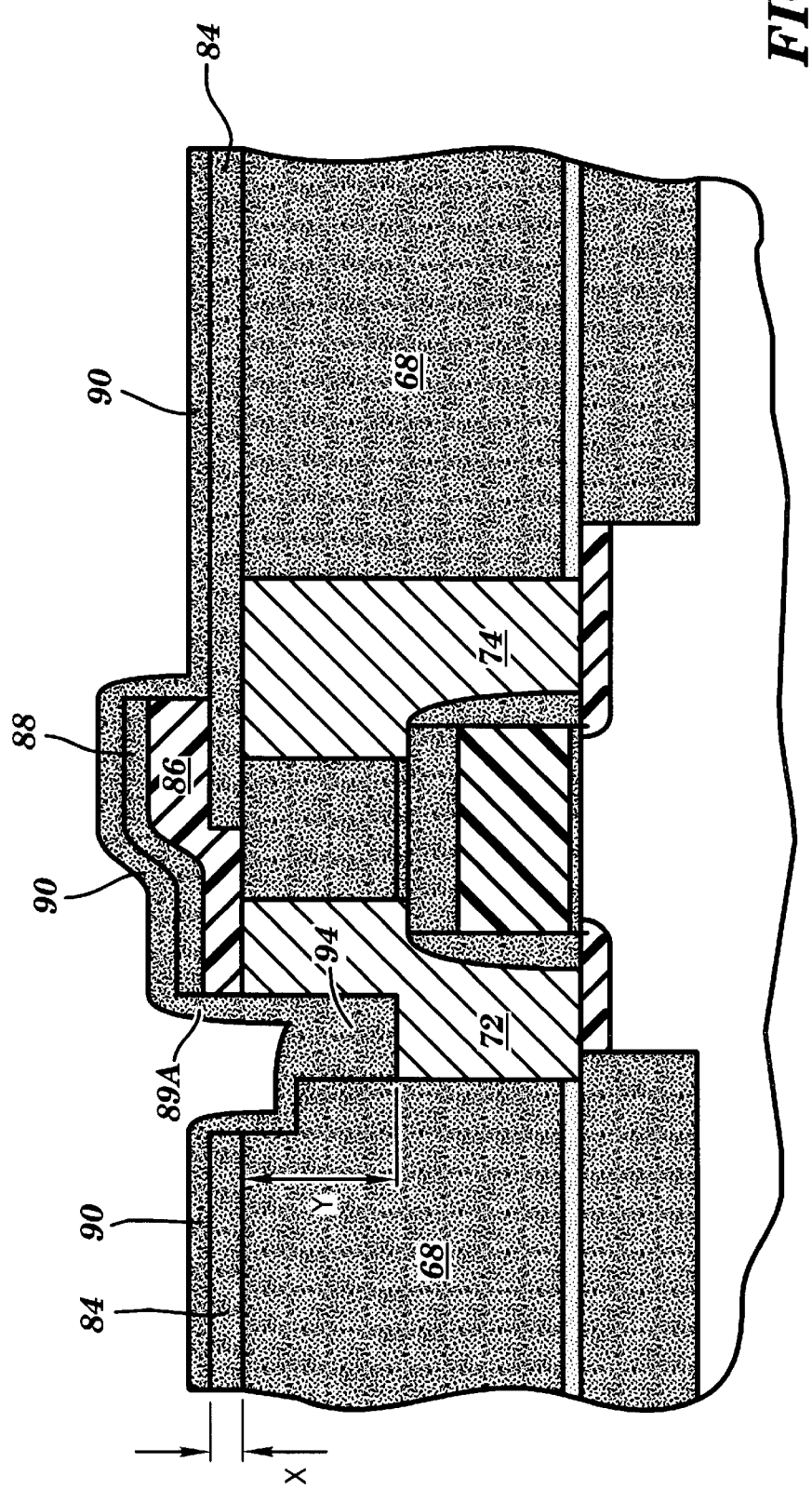
FIG. 4 depicts the stacked capacitor cell of FIG. 3 in continuing stages of preparation, based on the present invention.

During the patterning of bit-line 86 and cap oxide layer 88, bit-line stud recess 94 is purposefully formed. The stud recess is depicted in FIG. 4, filled with oxide after a subsequent step. The presence of the recess is a critical aspect of the present invention. Those skilled in the art realize that different methods for forming a recess are available, and selection of a particular technique is not critical. As an illustration, the recess (or "trench") may be formed prior to removal of the mask (not shown) being used to etch bit-line 86 and cap oxide layer 88. Over-etching with an etchant selective to the material forming bit-line stud 72 (e.g., a refractory metal or doped polysilicon, as discussed above) will create the recess.

The depth of the recess ("Y" in FIG. 4) must be greater than the thickness of stud differentiation layer 84 ("X" in FIG. 4). This ensures that when layer 84 and the bit-line spacer layer described below are subsequently removed, a protective insulating layer will remain in the recess. This insulating layer prevents the undesirable contact between the bit-line stud and an overlying storage capacitor node during subsequent manufacturing steps. In preferred embodiments, the depth of the recess is at least 100% greater than the thickness of layer 84.

After bit-line stud recess 94 has been formed, the bit-line/cap oxide mask is removed, and a bit-line spacer layer 90 is applied over all of the exposed regions, e.g., over stud differentiation layer 84 and cap oxide layer 88. Spacer layer 90 is usually formed of an oxide material, and can be deposited by conventional methods, like CVD. It is usually relatively thin, e.g., about 200 Angstroms to about 1500 Angstroms for the exemplary DRAM size specified previously.

Bit-line spacer layer 90 is then etched directionally (i.e., vertical to the substrate surface) by a suitable technique, such as RIE. The portion of the spacer layer 90 which remains performs two functions. First, it protects the sides of bit-line 86. Second, it fills (or partially fills) recess 94, insulating the underlying bit-line stud from an overlying storage capacitor node, as mentioned above. Thus, a separate mask does not have to be used to protect the stud during formation of the nodes. In a similar fashion, stud differentiation layer 84 is also removed by directionally etching, thereby exposing capacitor stud 74, but not exposing bit-line stud 72.

Figure 6:
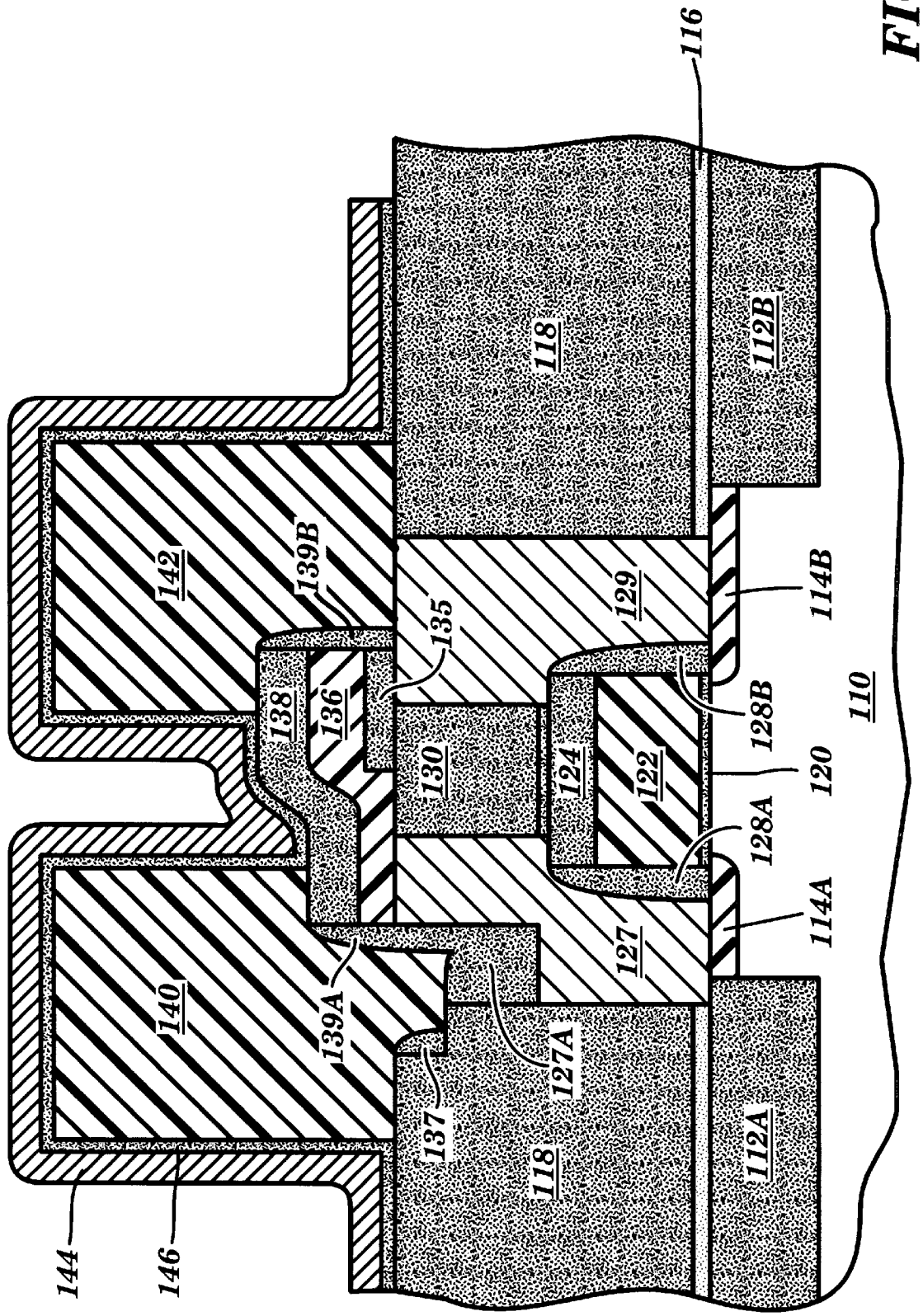
FIG. 6 depicts an alternative embodiment of a stacked capacitor cell based on this invention.

In some embodiments of this invention, an alternative sequence for some of the steps described above is preferred. In this instance, the over-etching step to form the recess is followed by removal of the stud differentiation layer in the manner described above. Bit-line spacer layer 90 is then deposited and removed by directionally-etching. In this alternative technique, the last-mentioned step only involves removal of the thickness of the spacer layer—not the removal of the thickness of both the spacer layer and the stud differentiation layer. Thus, there is less concern about inadvertently pulling down spacer 89A during the recess-etching step, and exposing the bit-line. The need for the thickness of layer 84 to be less than that of cap oxide layer 88 is also eliminated in this alternative embodiment. FIG. 6 and an accompanying explanation provided below clarify this embodiment.

At this point, a very desirable interim-structure for further construction of the STC cell has been prepared. The word line and bit-lines are in place, as are the bit-line stud and capacitor studs, with appropriate isolation between the various elements. The surface of the structure is also substantially planarized. Furthermore, the capacitor stud is exposed for eventual connection to an overlying storage node, while the bit-line stud is protected by the presence of a self-aligned recess, filled or partially filled with oxide.

Figure 5:
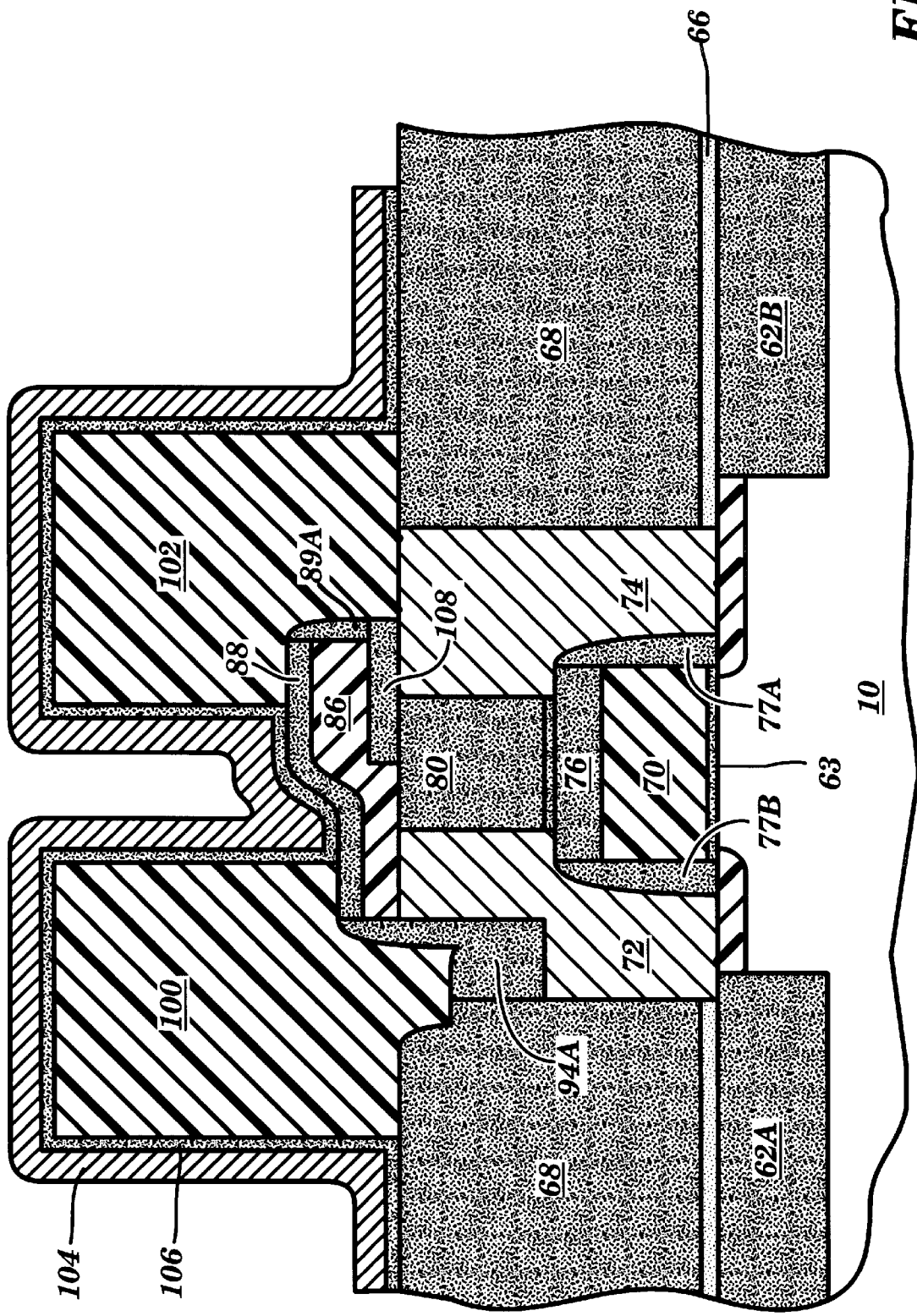
FIG. 5 depicts a completed stacked capacitor cell, based on the present invention.

The storage capacitor nodes depicted in FIG. 5 can now be formed. It should be understood that the design and shape of the capacitor nodes is not critical to the present invention. These well-known structures are described in a variety of references, e.g., U.S. Pat. No. 5,140,389, incorporated herein by reference. Similarly, various techniques for forming the storage capacitor nodes are also known in the art.

FIG. 5 depicts an exemplary STC structure (or "array") based on the present invention. It encompasses two storage capacitor nodes. The nodes can be formed by, first, depositing a very thick blanket layer of a polysilicon material by conventional techniques, such as CVD. The blanket layer is then patterned, by etching, into two rough chunks which encompass the eventual dimension of each node (100, 102). Additional patterning steps can then be carried out to shape the nodes into the more-uniform dimensions depicted in FIG. 5.

A node dielectric material 106 is then deposited over the entire surface of the array. Such a layer of material is known in the art to be a necessary component of a storage capacitor. It can be formed of a variety of materials, such as silicon dioxide, silicon nitride, a refractory metal oxide film such as tantalum oxide, or a composite material. Conventional techniques can be used to apply such a layer, e.g., CVD, sputtering, or by way of a spinning technique. Selection of the best technique will of course depend partly on the material being deposited.

A preferred dielectric material for some embodiments is a composite of silicon oxide and silicon nitride. It can be deposited solely by CVD, e.g. by flowing precursors of the two compounds through a reaction chamber. Alternatively, the layer could be formed by a combination of CVD and another process, e.g., CVD of the nitride material (or nitride-forming material), in conjunction with thermal oxidation of the material forming the underlying capacitor nodes, e.g., polysilicon. Such a technique is known in the art.

After deposition, dielectric layer 106 is patterned and etched by standard techniques to generally conform to the shape of capacitor nodes 100 and 102. As finally defined, layer 106 is relatively thin, e.g., about 50 Angstroms to about 500 Angstroms for the DRAM size mentioned above.

A plate conductor material is then deposited conformably over dielectric layer 106, forming layer 104, which in effect completes the structure of the capacitor itself. The plate could be formed of a variety of conductive materials, such as a refractory metal or doped polysilicon, e.g., n-doped polysilcon. It can be deposited by CVD, for example, and then patterned to generally conform to the underlying surface of dielectric layer 106. The thickness of the plate for the DRAM size mentioned above is usually in the range of about 500 Angstroms to about 3000 Angstroms.

It should again be emphasized that many other types of capacitor storage nodes could be utilized in the present invention. One type is described in the abovementioned article by Y. Kawamoto et al (1990 Symposium on VLSI Technology), which is incorporated herein by reference. The details for making that type of capacitor node do not have to be dealt with here. In brief, a standard capacitor structure, including a bit-line, a word line, and an overlying oxide coating, is depicted (studs are not used in the Kawamoto structure, since the capacitor nodes will be connected directly to active regions in the substrate).

A reverse pattern of the storage nodes is delineated in a spin-coated polyimide layer. A polysilicon layer is then deposited on the exposed surfaces by way of CVD, for example (the figures in the Kawamoto article are instructive in describing this sequence of fabrication). The polysilicon layer is then etched away, using a refilled resist mask within the trench area of the structure, leaving polysilicon only on the bottom and sidewalls of the polyimide trench pattern. The resist and the polyimide material are then removed, e.g, by ashing, and an insulator material such as tantalum oxide is deposited over exposed surfaces by a suitable technique, such as CVD. A conductor plate formed from a material such as tungsten is then applied over the insulator material to complete the STC cell structure.

A key aspect of the technology described in the Kawamoto reference is the use of a synthetic material like polyimide as a sacrificial layer for storage node formation. This temperature-resistant type of polymer can endure the heat treatment involved in CVD deposition of polysilicon. Those skilled in this area of DRAM fabrication understand that many variations on the materials and process steps and conditions of Kawamoto are possible, while still producing that general type of STC.

Another alternative which is also within the scope of the present invention involves the use of capacitor node structures which are "U"-shaped. In other words, a substantially rectangular capacitor node such as element 100 or 102 in FIG. 5 could be replaced by one which includes at least two "chimneys" or extensions which are connected to each other in the base region, i.e., the horizontal portion of a "U". This type of node shape may be preferable in certain instances, e.g, when a considerably high storage capacity is desirable. Its construction would be very similar to that described above for FIG. 5, using standard fabrication techniques.

After complete formation of the node structure (i.e., as shown in FIG. 5), various other standard connections for the STC cell can be formed. For example, several wiring levels can be connected, directly, or indirectly, to the cell array. Those of skill in the art understand that the particular types of connection to various peripheral structures will of course depend on the intended design and function of the STC cell, as well as on the design of the overall DRAM.

FIG. 6 represents an alternative embodiment of an STC cell based on the present invention. Most of the features are identical to those of FIG. 5. In other words, the alternative structure includes substrate 110, STI regions 112A and 112B, source/drain diffusion regions 114A and 114B, passivation layer 116, insulating region 118, gate oxide layer 120, word line 122, insulating cap layer 124, bit-line stud 127, capacitor stud 129, a portion 130 of insulating region 118, a residual portion 135 of the stud differentiation layer, bit-line 136, cap oxide layer 138, spacers 39A and 139B, first storage capacitor node 140, second storage capacitor node 142, late conductor 144, and node dielectric layer 146.

The STC structure of FIG. 6 results from a change in the sequence of several steps, as discussed previously. In other words, the over-etching step which was used to form bit-line stud recess 127A (partially or completely filled with an oxide or other insulation material at this point) was followed by removal of the stud differentiation layer, a portion of which remains as element 135. The bit-line spacer layer (substantially removed as of the time of completion of the structure in FIG. 6) was then deposited and removed by directionally-etching.

The differences between the structure of FIG. 6 and that of FIG. 5 are not major. A small shoulder 137 of the bit-line spacer layer is present, overlying the portion of insulating region 118 which is adjacent to recess 127A. Also, the bit-line cap 138 is thicker than the analogous feature in FIG. 5, i.e, bit-line cap 88. Moreover, spacer 139B directly contacts the upper surface of capacitor stud 129, rather than terminating at the residual stud differential layer 135, as occurs in FIG. 5. Again, though, the primary advantage of this alternative embodiment relates to processing, i.e., there is less concern about pulling down spacer 139A (and thereby exposing the bit-line) during the recess-etching step, as discussed previously. The bit-line stud recess is still situated to perform its function, i.e., isolating the bit-line stud from the overlying storage capacitor node 140.

It should be clear that the applicability of this invention is not limited to STC's. Thus, another aspect is directed to a semiconductor structure, comprising:

(a) a first lower conductor disposed in an insulating region, having an upper surface and a lower surface;

(b) a second lower conductor disposed in the insulating region, electrically isolated from the first lower conductor, and having an upper surface and a lower surface;

(c) a first upper conductor disposed over at least a portion of the upper surface of the first lower conductor; and electrically isolated therefrom;

(d) a second upper conductor disposed over at least a portion of the upper surface of the second lower conductor; and electrically connected thereto.

As should be apparent from the specific embodiment discussed previously, the first lower conductor has a recess in its upper surface that is self-aligned to the first upper conductor. The recess is at least partially filled with an insulator, thereby electrically isolating the first lower conductor from the first upper conductor. This insulation structure is of great value when the conductors have been formed by lithographic-based patterning and etching techniques, as described above.

While preferred embodiments of this invention have been disclosed, it should be understood that various modifications may be made. It is intended that the claims which follow cover all such modifications which fall within the true spirit and scope of this invention.

All of the above-referenced patents, articles, and texts are incorporated herein by reference.

We claim:

1. A semiconductor structure, comprising:
   (a) a first lower conductor disposed in an insulating region, having an upper surface and a lower surface;
   (b) a second lower conductor disposed in the insulating region, electrically isolated from the first lower conductor, and having an upper surface and a lower surface;
   (c) a first upper conductor disposed over at least a portion of the first lower conductor; and electrically isolated therefrom;
   (d) a second upper conductor disposed over at least a portion of the second lower conductor; and electrically connected thereto;
   wherein the first lower conductor is isolated from the first upper conductor by a recess in the upper surface of the first lower conductor, said recess being self-aligned to the first upper conductor, and being at least partially filled with an insulator.

2. The structure of claim 1, wherein an insulating layer is disposed over a portion of the surface of the insulating region.

3. The structure of claim 2, wherein the thickness of the insulating layer is less than the depth of the recess in the first lower conductor.

4. The structure of claim 1, wherein at least one of the first and second upper conductors is a storage capacitor node.

5. The structure of claim 1, wherein the first lower conductor is a bit-line stud.

6. The structure of claim 5, wherein the second lower conductor is a capacitor stud.

7. The structure of claim 6, wherein the first and second upper conductors are storage capacitor nodes.

8. The structure of claim 7, wherein the capacitor nodes are formed of a material comprising polysilicon.

9. The structure of claim 7, wherein the capacitor nodes are covered by a conductive layer.

10. A stacked capacitor cell according to claim 1, wherein the first lower conductor is a bit-line stud, the second lower conductor is a capacitor stud, and the first and second upper conductors are storage capacitor nodes, said capacitor cell further comprising a bit-line disposed between the capacitor nodes, and isolated therefrom, and a word line situated within the insulating region.

11. A dynamic random access memory (DRAM) device, comprising at least one stacked capacitor cell according to claim 10.

* * * * *